(12) United States Patent
Meyer et al.

(10) Patent No.: US 7,221,053 B2
(45) Date of Patent: May 22, 2007

(54) INTEGRATED DEVICE AND ELECTRONIC SYSTEM

(75) Inventors: Thorsten Meyer, Dresden (DE); Harry Hedler, Germering (DE); Stephan Dobritz, Dresden (DE)

(73) Assignee: Infineon Technologies AG, Munich (DE)

( * ) Notice: Subject to any disclaimer, the term of this patent is extended or adjusted under 35 U.S.C. 154(b) by 73 days.

(21) Appl. No.: 11/086,922

(22) Filed: Mar. 21, 2005

(65) Prior Publication Data

US 2006/0208357 A1    Sep. 21, 2006

(51) Int. Cl.
*H01L 23/48* (2006.01)
*H01L 23/52* (2006.01)
*H01L 29/40* (2006.01)

(52) U.S. Cl. ............... 257/737; 257/738; 257/E23.021; 257/E23.069; 257/E21.508; 438/613; 438/614; 438/615; 438/616; 438/617

(58) Field of Classification Search ............ None
See application file for complete search history.

(56) References Cited

U.S. PATENT DOCUMENTS

| 6,177,729 B1 * | 1/2001 | Benenati et al. ............ 257/738 |
| 2002/0100610 A1 * | 8/2002 | Yasuda et al. ............... 174/260 |

\* cited by examiner

*Primary Examiner*—Jasmine Clark
(74) *Attorney, Agent, or Firm*—Patterson & Sheridan, L.L.P.

(57) ABSTRACT

The present invention relates to an integrated device comprising an electronic circuit chip, a solder contact structure to provide contact to the electronic circuit chip and an elastic contact structure to provide contact to the electronic circuit chip, wherein the solder contact structure and the elastic contact structure are arranged on a contacting surface of the integrated device.

34 Claims, 6 Drawing Sheets

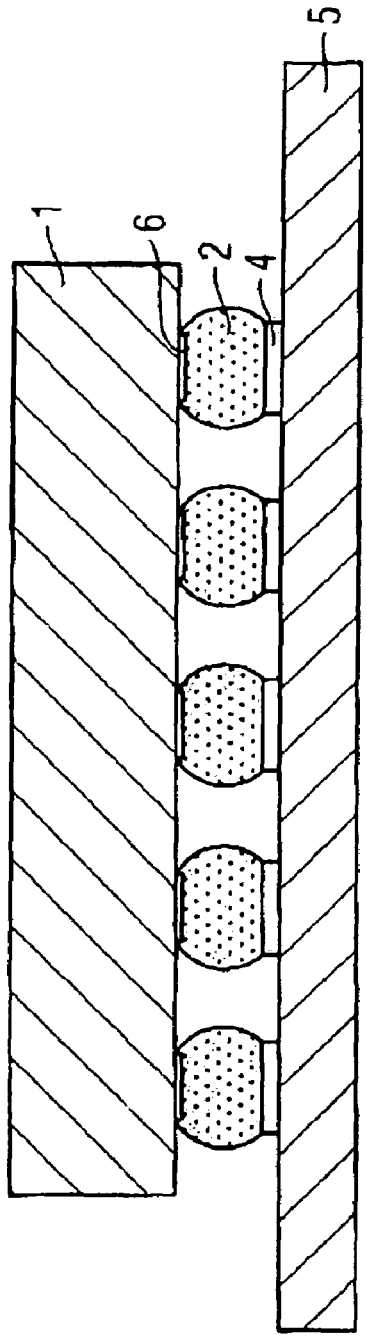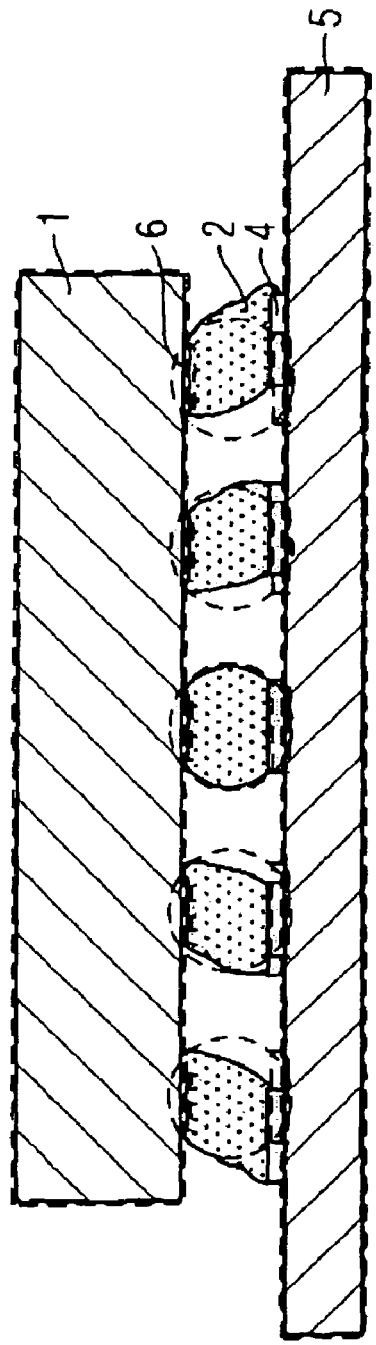

INTEGRATED DEVICE AND ELECTRONIC SYSTEM

BACKGROUND OF THE INVENTION

1. Field of the Invention

The present invention relates to an integrated device designed to be attached on a contacting substrate such as a printed circuit board. The present invention further relates to an electronic system including a printed circuit board on which an integrated device is attached.

2. Description of the Related Art

Integrated devices such as Ball Grid Arrays (BGA) or Flip-Chip devices comprise solder balls for contacting and attaching of the integrated device to a printed circuit board. The integrated device is fixed onto the printed circuit board by placing the integrated device on the printed circuit board so that solder balls abut on respective contact pads of the printed circuit board. A heating process is applied thereafter so that the solder balls melt and contacting joints between the integrated device and the abutting contact pads of the printed circuit board are developed.

While operating the integrated device, heat is dissipated which leads to thermal mechanical stress due to differing thermal expansion coefficients. For example, the coefficient of thermal expansion (CTE) of a silicon chip is about 2.5 ppm/° K and the CTE for the printed circuit board is about 17 ppm/° K. The difference of the thermal expansion due to an increased operating temperature results in a shear stress affecting the solder joints between the integrated device and the printed circuit board. As the solder joints of the integrated device are spread over the surface area of the integrated device, the solder joints are exposed to different shear stresses. Usually, the shear stress on the solder joints in an outer region of the contacting area between the integrated device and the printed circuit board is higher than the shear stress of the solder joints in an inner region of the contacting area. Shear stress leads to a deterioration of the solder joints which can lead to a breaking of the electrical connection between the contact pad of the printed circuit board and the respective contact of the integrated device.

In order to test and possibly improve the reliability of an electronic system with integrated devices attached on a printed circuit board, the electronic system is initially tested in a temperature cycle test, which is typically carried out in a temperature range between −40° C. to 125° C. This temperature cycle is usually repeated 500 to 1000 times, so that the solder joints experience repeated change in the shear stress. Particularly for the solder joints in the outer region of the contacting area, the repeated cycles of changing shear stress may lead to breaking and a substantive deterioration of the solder joint.

To overcome the issue of the degradation of the solder joints due to shear stress (thermomechanical stress), flexible contact elements such as springs or elastic bumps can be used to provide a thermomechanically reliable contact between the integrated device and the printed circuit boards. Elastic bumps can be produced by using a silicone bump on which a rerouting is deposited, extending from the tip of the elastic bump to a respective contact pad of the integrated device, for memories typically located in a center row of the die. The rerouting may only be soldered at the bump top, so that only the bump top is connected to the printed circuit board during reflow soldering, maintaining the flexibility of the silicone bump. As a result, the elastic bumps can absorb the shear stress so that no breaking or cutting of the electrical connection occurs in thermomechanical stress. The flexible contact element can provide reliability during thermomechanical stress; however, due to its resilient nature it cannot serve to ensure the mechanical stability of the package. Therefore, an additional fixing such as a lid or heatspreader is required. However, the additional fixing of the integrated device on the printed circuit board is space-consuming and increases the costs of the assembly of the electronic system. Another possibility is to use an underfill for mechanical stabilization. If an underfill is used it inflexibly glues the integrated device to the printed circuit board. The shear stress is transferred into bend stress of the complete printed circuit board, leading to thermomechanical and mechanical sturdiness. However, underfilling is a very expensive process step, leads to reliability problems in humidity testing and inhibits double sided assembly of integrated devices on the printed circuit board.

SUMMARY OF THE INVENTION

One embodiment of of the present invention provides an integrated device which can be joined to a printed circuit board without the necessity of an additional fixing.

Another embodiment of the present invention provides an integrated device which, when attached to a printed circuit board, has a reduced shear stress degradation of the contacting joints between the integrated device and the printed circuit board.

According to a first aspect of the present invention, an integrated device is provided which comprises an electronic circuit chip, a solder contact structure to provide contact to the electronic circuit chip and an elastic contact structure designed to provide contact to the electronic circuit chip. The solder contact structure and the elastic contact structure are both arranged on the same surface of the integrated device.

The integrated device of the present invention provides a solder contact structure and an elastic contact structure, which are both arranged on the contacting surface of the integrated device. Thus, the number of solder contact structures which are exposed to shear stress degradation may be reduced, so that the reliability of the integrated device may be increased. Due to the resilient nature of the elastic contact elements, further fixing is required and may be achieved by using the described solder interconnects.

The solder contact structure may be provided as a solder ball.

The elastic contact structure may be designed as an elastic bump on which a contact wiring is provided to ensure contact.

The height of the elastic contact structure may be larger than the height of the solder ball in its contacting state.

According to one embodiment of the present invention, the integrated device is a Flip-Chip device.

According to a further embodiment of the present invention, the integrated device comprises a housing (backside and edge protection of the chip), which may include a contacting surface outside of the silicon chip area, on which both the solder contact structure and the elastic contact structure can be arranged (fan-out area). The housing may be in the form of a ball grid array package to provide the integrated device packaged as a ball grid array package.

A number of solder contact structures and a number of elastic contact structures may be provided on the surface of the integrated device, wherein the positions of the number of solder contact structures are arranged within a surface area in which the solder contact structures in a soldered condition are subjected to a shear stress due to thermo-mechanical expansion which is lower than a predetermined shear stress value. This means that the solder interconnect does not exhibit any failures in the form of cracking or other degradation due to thermomechanical stress prior to a given life time. The contacting area may be divided into a first region wherein the solder contact structures are arranged and a second region wherein the elastic contact structures are arranged. The first region is defined as a region wherein the shear stress during temperature cycles is sufficiently low such that no degradation of the solder contact structures is expected. The second region is defined as a region wherein, if solder contact structures were provided, the shear stress would exceed a shear stress limit such that a substantial degradation of the solder contact structure in their contacting state would be expected. Due to the resilient nature of the contact elements in this second region, the thermo-mechanical stress does not cause any substantial degradation of the contact elements.

According to one embodiment of the present invention, the first surface area including the number of solder contact structures is substantially positioned in a middle of the contacting area of the integrated device. Thereby, a stable fixing of the integrated device on the printed circuit board can be provided when the integrated device is soldered to the printed circuit board, and the elastic contact structures arranged in a second surface area of the integrated device are able to absorb the shear stress which usually increases with an increasing distance from the first surface area.

According to another aspect of the present invention, an electronic system is provided, comprising a printed circuit board and an integrated device. The integrated device comprises an electronic circuit chip, a solder contact structure and an elastic contact structure designed to provide contact to the electronic circuit chip, wherein the solder contact structures and the elastic contact structures are arranged on the same surface of the integrated device. The solder contact structure and the elastic contact structure of the integrated device are soldered onto the printed circuit board in such a way that the solder contact structure and the elastic contact structure are in contact with respective contact pads of the printed circuit board.

As both solder contact structure and elastic contact structure are used to provide contact, the reliability of the electronic system may be increased as the number of solder contact structures to connect the integrated device with the printed circuit board are reduced. Furthermore, the electronic system does not need any fixing to mechanically hold the integrated device since the solder contact structure provides a secure mechanical support of the integrated device on the printed circuit board.

According to one embodiment of the present invention, a plurality of solder contact structures and a plurality of elastic contact structures are provided on the contacting surface of the integrated device. The positions of the solder contact structures are arranged within a first surface area in which the solder contact structures in a soldered condition are subjected to a shear stress due to thermo-mechanical expansion which is lower than a predetermined shear stress value.

The elastic contact structures may be positioned outside the first surface area. The first surface area may be substantially positioned in a middle of the contacting area of the integrated device close to the chip center. The elastic contact structures may be located outside of the first surface area, e.g., closer to the edge of the die. Due to their resilient nature, the eleastic contact structures can compensate the CTE mismatch of chip and PCB board.

A further aspect of the present invention provides a method for producing an integrated Flip-Chip device. The method comprises the steps of providing a substrate including integrated circuits having contact pads in a contacting area, providing an elastic structure on the contacting area of the Flip-Chip device, providing a redistribution wiring layer to provide a contact base pad as well as a connection line between a contact pad and a tip of the elastic contact structure and providing a solder contact structure on the contact base pad.

One embodiment of the present invention provides a method of producing an integrated device having both solder contact structures and elastic contact structures.

A solder stop layer may be provided on the redistribution wiring layer such that the metal base pad is uncovered. The solder stop layer prevents the solder from flowing and accidentally taking shortcuts between connection lines and/or metal base pads.

According to one embodiment, the elastic contact structure on a contacting surface of the Flip-Chip device is provided by a screen printing process, wherein silicone, for example, or another soft material is applied through a printing mask.

A plurality of solder contact structures and a plurality of elastic contact structures may be provided on the contacting surface of the integrated device, wherein the positions of the solder contact structures are arranged within a first surface area in which the solder contact structures in a soldered condition are subjected to a shear stress due to thermo-mechanical expansion which is lower than a predetermined shear stress value (at which may cause failure in the package).

The elastic contact structures may be positioned substantially outside the first surface area in a second surface area.

The first surface area with the solder contact structures is substantially positioned in a middle of the contacting area of the Flip-Chip device close to the neutral point of the chip center.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 1A and FIG. 1B show an electronic system including a Flip-Chip device soldered to a printed circuit board at room temperature and at an increased temperature to illustrate the shear stress to which the contacting joints are exposed;

DETAILED DESCRIPTION OF THE PREFERRED EMBODIMENT

Figure 2:
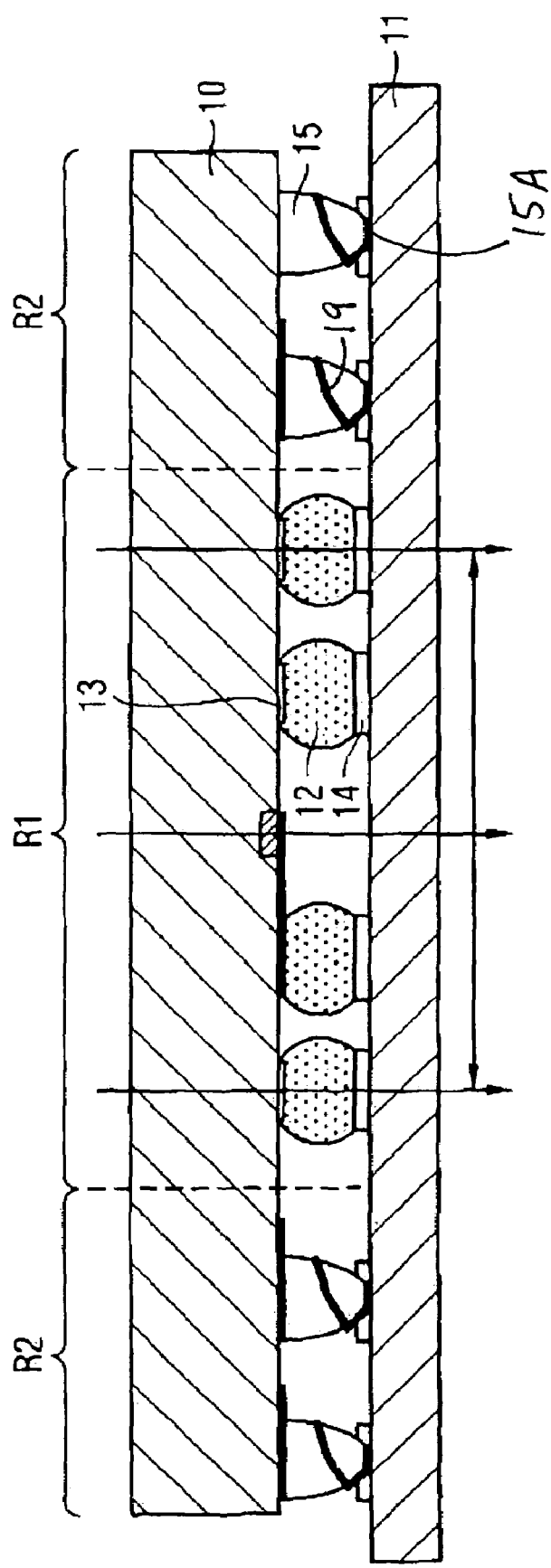
FIG. 2 shows a cross-sectional view of an electronic system including an integrated device which is attached to a printed circuit board according to one embodiment of the present invention.

With regard to FIG. 1A, a conventional Flip-Chip device 1 is shown which comprises solder balls 2. The solder balls 2 are arranged on landing pads 6 of the Flip-Chip device 1 and are soldered to contact pads 4 of a printed circuit board 5. The contact pads 4 are normally coupled to interconnection wiring which is lead on or in the printed circuit board, e.g., to other electronic devices (not shown). After soldering, the landing pads 6 of the Flip-Chip device 1 and the contact pads 4 of the printed circuit board 5 are solidly interconnected as the solder of the solder balls 2 provides a rigid mechanical support between the Flip-Chip device 1 and the printed circuit board 5.

As shown in FIG. 1B, due to different thermal expansion coefficients of the Flip-Chip device (e.g., silicon chip) 1 and the printed circuit board 5, some of the contacting joints formed by the soldered solder balls 2 are exposed to shear stress which can lead to degradation of the contacting joints if heat is applied repeatedly in a number of cycles. The stress values in the solder balls 2 increase from the center to the edge of the die, according to the increase of absolute mismatch between the chip and the board with increasing distance from the center of the die (neutral point).

According to increasingly strict requirements, electronic systems have to withstand a number of cycles of heating and cooling in which no substantial degradation of the contacting joints shall occur. In some cases, the requirement is that the electronic system has to withstand 500 to 1000 cycles of a temperature change between $-40°$ C. to $125°$ C. This temperature stress test applies maximum shear stress onto some of the solder balls (with large DNP) so that a breaking of a contacting joint is highly probable. Particularly, the contacting joints in an outer region of the contacting area are exposed to higher shear stresses than the contacting joints closer to the middle of the surface area.

In FIG. 2, one embodiment of the present invention is shown. The electronic system of FIG. 2 shows a device (e.g., Flip-Chip device) 10 which is attached to a printed circuit board 11 in such a way that an electrical contact via contacting joints is provided. In a first region R1 of the contacting area, a number of solder balls is provided which are attached (soldered) to landing pads 13 of the Flip-Chip device 10. In the electronic system as shown in FIG. 2, the solder balls 12 are shown in a soldered condition where the solder balls 12 are soldered to contact pads 14 of the printed circuit board 11. The contact pads 14 are in connection to other electronic devices on the printed circuit board or outside of the printed circuit board 11.

Outside of the first region R1 in a second region R2, elastic bumps 15 are provided. The second region R2 is located closer to the outer edge of the Flip-Chip device, as can be seen in more detail with regard to FIG. 3.

The elastic bumps may be made from a resilient material such as silicone, for example, and provided in a conical shape such that a contacting tip is formed. As silicone is typically non-conductive, a conductive wiring 19 is provided which leads from the tip 15A of the silicone bump 15 to a respective contact point 16 of the Flip-Chip device 10. The conductive wiring 19 may contain graphite or other conductive material which is highly resistive against deformation. The conductive wiring 19 (also referred herein as redistribution line, RDL) may be positioned spirally around the silicone bump 15 to absorb shear forces on the silicone bump in all directions.

Figure 3:
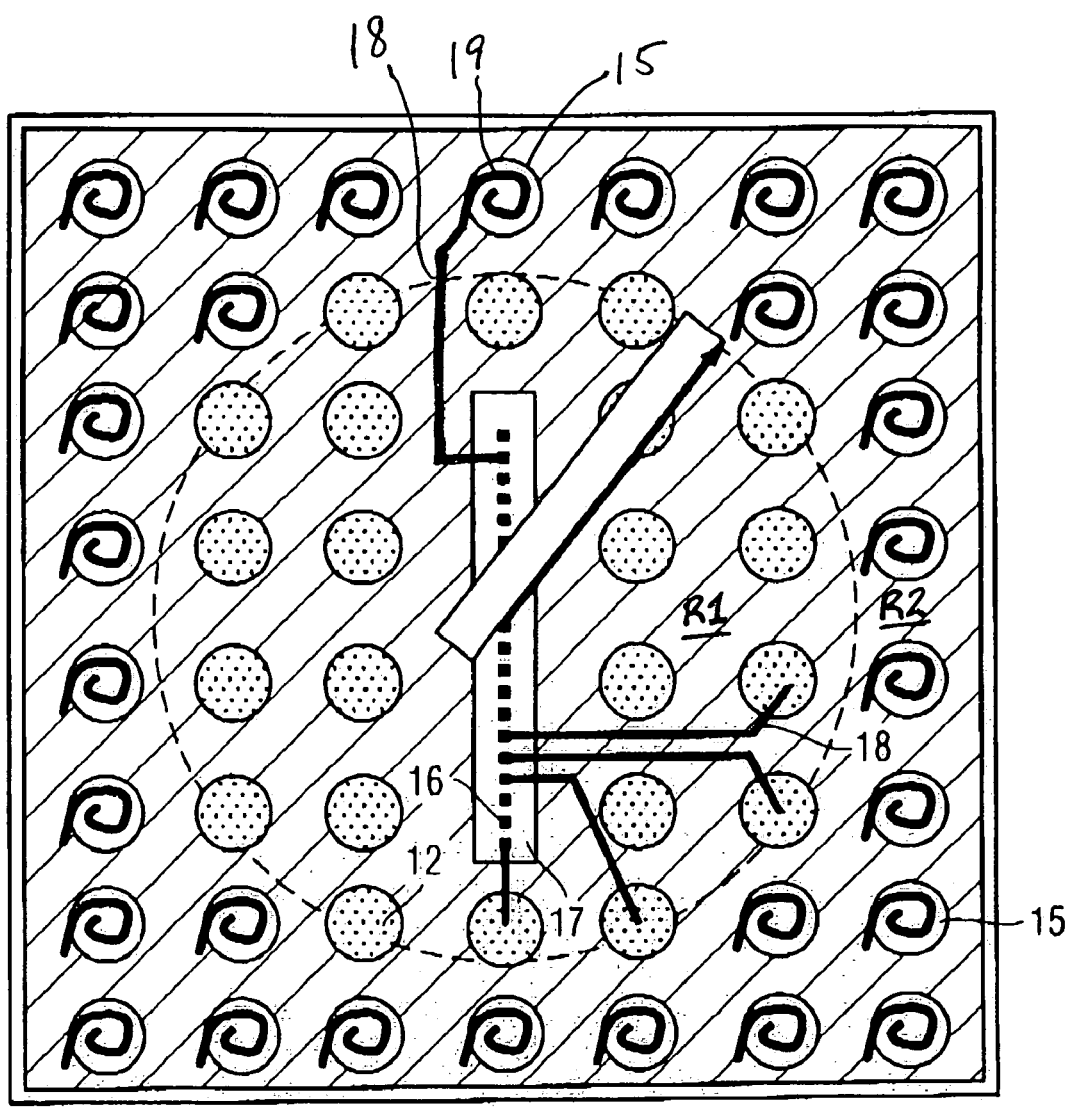
FIG. 3 shows a top view on the contacting surface of the integrated device according to one embodiment of the present invention.

In FIG. 3, a top view onto the contacting surface of the Flip-Chip device 10 is shown. Referring to both FIGS. 2 and 3, in a first region R1 which is located in the middle of the Flip-Chip device 10, solder balls 12 are arranged on the respective contact pads 14, and outside of the first region R1 in the second region R2, elastic silicone bumps 15 are provided with the respective conductive wiring 19 to provide an electrical connection to contact pads 14 of the printed circuit board 11. As shown in FIG. 3, a contact point area 17 of the Flip-Chip device 10 is arranged in the center or central area of the Flip-Chip, and redistribution wiring 18 (not all shown for purpose of clarity in the drawing) is provided to each of the landing pads 13 of the Flip-Chip device 10, on which the solder balls 12 are provided, and to the contacting wiring of the elastic silicone bumps 15.

The first region R1 is generally defined as a region (e.g., circular) extending around a central point of the chip (also called neutral point), where generally no mismatch in the absolute expansion values occurs between chip and PCB board, and at which the resulting shear forces caused by thermal expansion are compensated. The radius of the first region R1 is defined by the maximum shear stress value which is allowed for a solder contacting joint to resist the stresses under test conditions (temperature cycling). The solder joints in a soldered condition of the integrated Flip-Chip device provide a mechanical sturdiness and stability for the Flip-Chip device 10 on the printed circuit board 11 which can otherwise only be achieved by an underfill, undermold or additional mechanical fixing.

The present invention applies to all electronic and/or integrated devices having contact structures which are designed to contact the contact pad of a printed circuit board by electrically conductive gluing, soldering and/or by applying a contact force to it. In one embodiment, the device comprises a housing including the contacting surface on which the solder contact structure and the elastic contact structure are arranged. The device may be packaged as a ball grid array package, a Flip-Chip package or other types of packaging.

The use of the solder balls to provide contact to the respective contact pads of the printed circuit board as well as a mechanical fixing of the Flip-Chip device to the printed circuit board renders the use of an underfill or a mechanical fixing obsolete or unnecessary.

If the flexible silicone bumps 15 are not conductively soldered or glued to the printed circuit board, the height of the elastic silicone bumps 15 is preferably larger than the height of the solder balls 12 in its soldered condition. The greater height of the bumps 15 provides a contacting force onto the contact pads 14 of the printed circuit board 11 when the solder balls 12 have been soldered onto the contact pads 14.

Figure 4A:
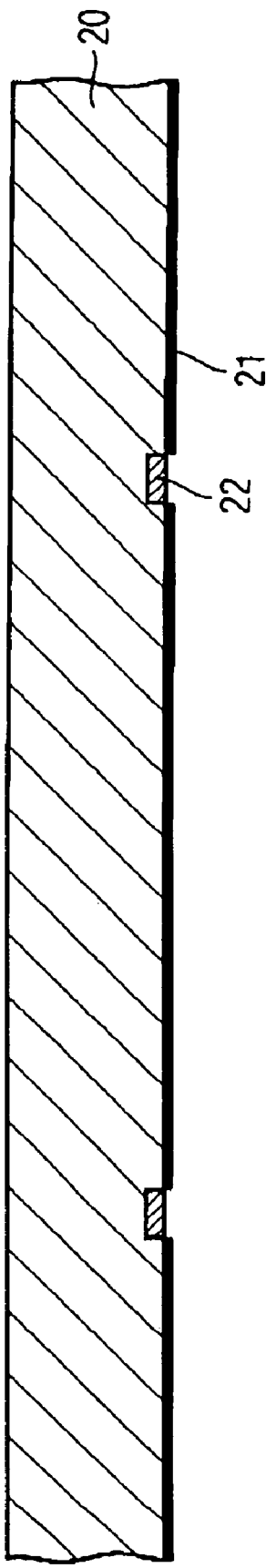
FIGS. 4A to 4E show method steps of a production method for a Flip-Chip device according to one embodiment of the present invention.
Figure 4B:
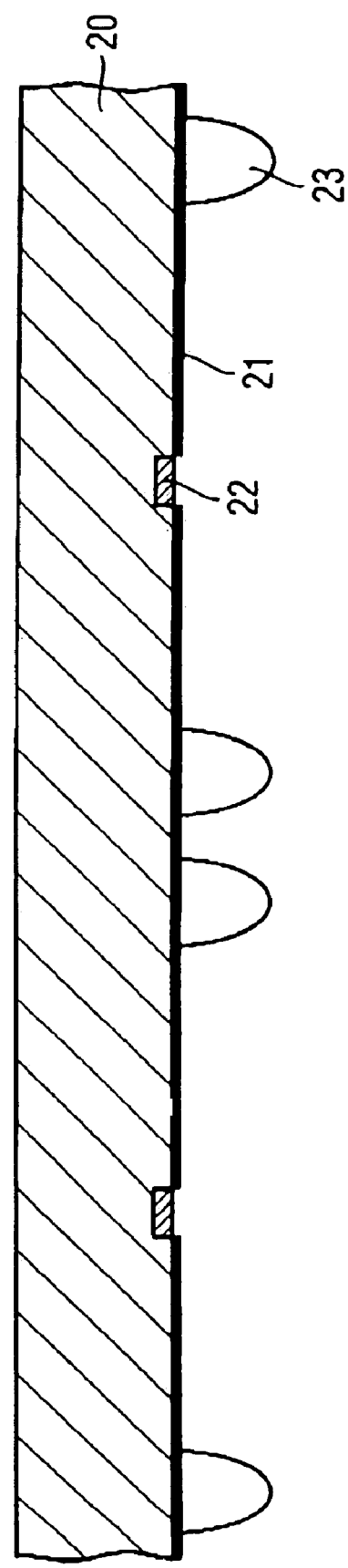

In FIGS. 4A to 4E, a production method for producing an integrated device according to one embodiment of the present invention is shown. As shown in FIG. 4A, a wafer 20 is provided including an electronic circuit (not shown) which can be contacted by contacts in a contacting area 22. If necessary, the surface of the wafer is provided with an isolating layer 21 which abuts on the contacts in the contacting area 22. On the isolating layer 21, elastic bumps 23, e.g., silicone bumps, are provided, e.g., by means of a screen printing process and such like processes, as shown in FIG. 4B.

Figure 4C:
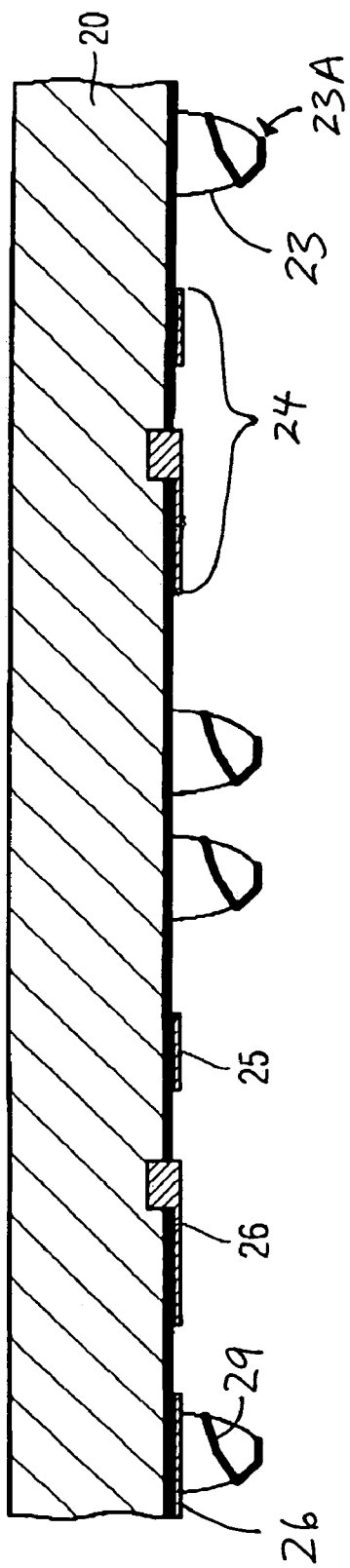

After the screen printing process, a redistribution layer 24 is deposited onto the contacting surface of the wafer. As shown in FIG. 4C, the redistribution layer 24 comprises landing pads 25 and a redistribution wiring 26 which provides an interconnection between the contacts of the contacting area 22 of the wafer (or chip) 20 and the landing pads 25 as well as an interconnection between the contacts of the contacting area 22 of the chip 20 to the tip 23A of the elastic silicone bumps 23. The redistribution wiring 26 includes the conductive wiring 29 (also referred to herein as redistribution line) is led from a respective contact of the contacting area 22 to the silicone bump 23 and winding up to the tip 23A of the silicone bump 23 in a spiral shape as shown or in any other design (e.g., straight line). The deposition of the redistribution layer 24 may be performed, for example, by depositing a seed layer on the contacting surface, depositing a photoresist on the seed layer and providing openings in the photoresist layer by exposure and development of the resist, and plating of one or more metals such as Cu, Ni and/or Au only in the locations defined by the openings in the photoresist layer. Afterwards, the photoresist layer and the seed layer are removed so that the redistribution wiring structures remain on the contacting surface of the wafer, as shown in FIG. 4C.

Figure 4D:
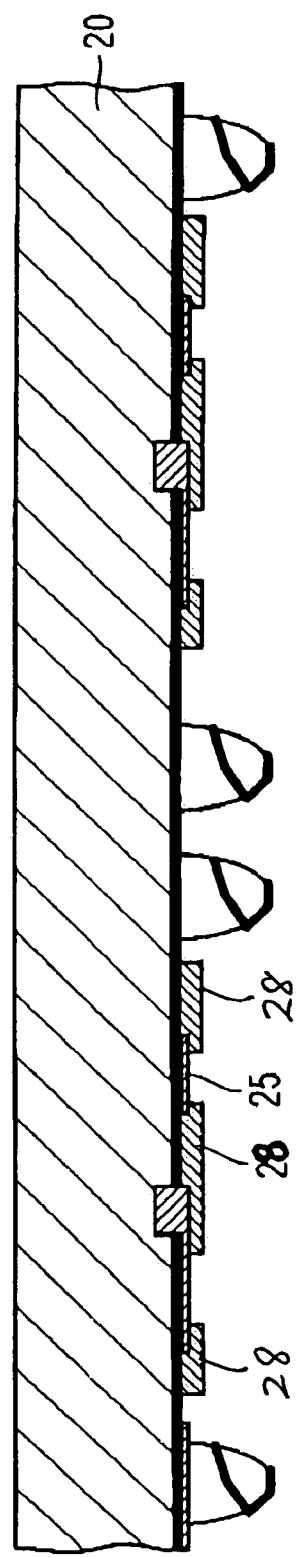

FIG. 4D shows a solder stop layer 26 provided to prevent the solder balls from contacting the redistribution layer 24 during reflow.

Figure 4E:
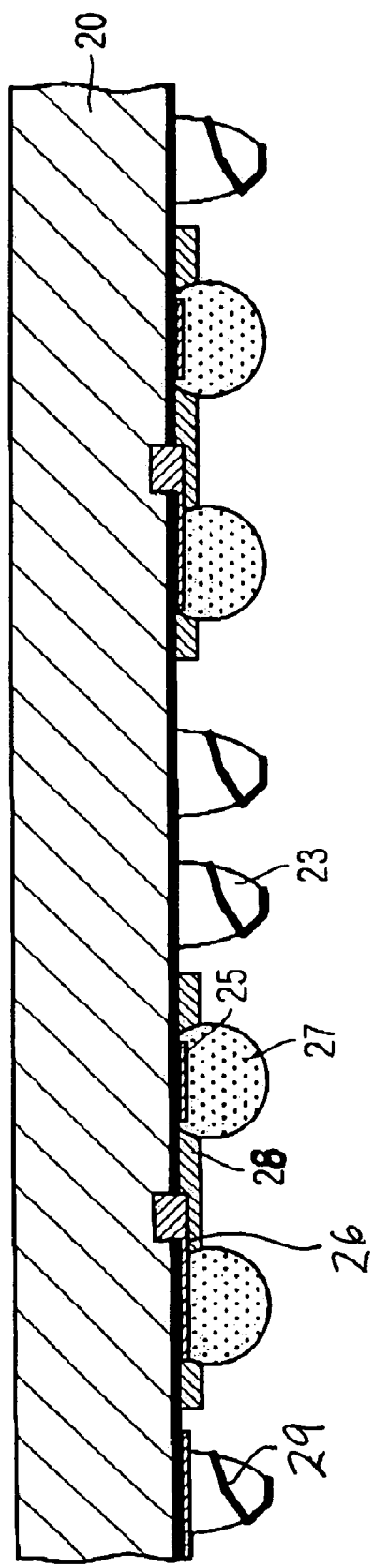

In FIG. 4E, a method state is shown after the application of solder balls 27 on the landing pads 25 provided by the redistribution layer 24. After sawing the wafer, a Flip-Chip device is obtained which has both rigid and flexible contacting structures to reduce the negative effects of shear stress due to temperature cycles and to mechanical sturdiness during drop tests or shock tests.

While the foregoing is directed to embodiments of the present invention, other and further embodiments of the invention may be devised without departing from the basic scope thereof, and the scope thereof is determined by the claims that follow.

What is claimed is:

1. An integrated device, comprising:
   an electronic circuit chip;
   a solder contact structure disposed in electrical connection to the electronic circuit chip; and
   an elastic contact structure disposed in electrical connection to the electronic circuit chip;
   wherein the solder contact structure and the elastic contact structure are both arranged on a contacting surface of the integrated device; and
   wherein the elastic contact structure comprises an elastic bump and a conductive wiring disposed on the elastic bump.

2. The integrated device of claim 1, wherein the solder contact structure comprises a solder ball.

3. The integrated device of claim 2, wherein a height of the elastic contact structure is at least as large as a height of the solder ball in a soldered state.

4. The integrated device of claim 3, wherein the integrated device is a Flip-Chip device.

5. The integrated device of claim 3, further comprising a housing including the contacting surface on which the solder contact structure and the elastic contact structure are arranged.

6. The integrated device of claim 5, wherein the integrated device is packaged as a ball grid array package.

7. The integrated device of claim 1, wherein a plurality of solder contact structures and a plurality of elastic contact structures are provided on the contacting surface of the integrated device, wherein the plurality of solder contact structures are arranged within a first surface area in which the solder contact structures in a soldered condition are subjected to a shear stress due to thermo-mechanical expansion mismatch which is lower than a predetermined shear stress value.

8. The integrated device of claim 7, wherein the first surface area is substantially positioned in a central area of the contacting surface of the integrated device and wherein the plurality of elastic contact structures is positioned in a second surface area which is located radially outside the first surface area.

9. The integrated device of claim 8, wherein each solder contact structure comprises a solder ball, wherein each elastic contact structure comprises an elastic bump and a conductive wiring disposed on the elastic bump and wherein a height of each elastic contact structure is at least as large as a height of each solder ball in the soldered condition.

10. The integrated device of claim 9, further comprising:
    a redistribution layer disposed on the contact surface of the integrated device to electrically connect respective solder contact structure and elastic contact structure to the electronic circuit chip.

11. The integrated device of claim 10, wherein the redistribution layer comprises a landing pad connected to the solder contact structure and a redistribution wiring connected to the elastic contact structure.

12. The integrated device of claim 11, further comprising:
    a solder stop disposed substantially around the landing pad.

13. The integrated device of claim 8, further comprising a housing including the contacting surface on which the solder contact structure and the elastic contact structure are arranged, wherein the integrated device is packaged as at least one of one of a ball grid array package and a Flip-Chip package.

14. An electronic system, comprising:
    a printed circuit board having a plurality of contact pads;
    an integrated device comprising:
       an electronic circuit chip;
       one or more solder contact structures disposed in electrical connection to the electronic circuit chip; and
       one or more elastic contact structures disposed in electrical connection to the electronic circuit chip;
       wherein the solder contact structures and the elastic contact structures are both arranged on a contacting surface of the integrated device, wherein the elastic contact structure comprises an elastic bump and a conductive wiring disposed on the elastic bump and wherein the solder contact structures of the integrated device is soldered on the printed circuit board such that the solder contact structures and the elastic contact structures are in contact with respective contact pads of the printed circuit board.

15. The electronic system of claim 14, wherein each solder contact structure comprises a solder ball.

16. The electronic system of claim 15, wherein a height of each elastic contact structure is at least as large as a height of each solder ball in a soldered condition.

17. The electronic system of claim 16, wherein the integrated device is packaged as a Flip-Chip package.

18. The electronic system of claim 16, wherein the integrated device further comprises a housing including the contacting surface on which the solder contact structure and the elastic contact structure are arranged.

19. The electronic system of claim 18, wherein the integrated device is packaged as a ball grid array package.

20. The electronic system of claim 14, wherein at least one integrated device is provided on each side of the printed circuit board.

21. The electronic system of claim 14, wherein the one or more solder contact structures are arranged within a first surface area in which the solder contact structures in a soldered condition are subjected to a shear stress due to thermo-mechanical expansion mismatch which is lower than a predetermined shear stress value.

22. The electronic system of claim 21, wherein the first surface area is substantially positioned in a central area of the contacting surface of the integrated device and wherein the elastic contact structures are positioned radially outside the first surface area.

23. The electronic system of claim 22, wherein at least one integrated device is provided on each side of the printed circuit board.

24. The electronic system of claim 22, wherein each solder contact structure comprises a solder ball, wherein each elastic contact structure comprises an elastic bump and a conductive wiring disposed on the elastic bump and wherein a height of each elastic contact structure is at least as large as a height of each solder ball in the soldered condition.

25. The electronic system of claim 24, wherein the integrated device further comprises a housing including the contacting surface on which the solder contact structure and the elastic contact structure are arranged and wherein the integrated device is packaged as one of a ball grid array package and a Flip-Chip package.

26. The electronic system of claim 24, further comprising:
a redistribution layer disposed on the contact surface of the integrated device to electrically connect respective solder contact structures and elastic contact structures to the electronic circuit chip.

27. The electronic system of claim 26, wherein the redistribution layer comprises a respective landing pad connected to each solder contact structure and a respective redistribution wiring connected to each elastic contact structure.

28. The electronic system of claim 27, further comprising:
a solder stop disposed substantially around each landing pad.

29. A method for producing an integrated device, comprising:
providing an integrated circuit on a substrate, the integrated circuit having a plurality contact points in a contacting area;
providing an elastic contact structure in the contacting area, wherein the elastic contact structure comprises an elastic bump and a conductive wiring disposed on the elastic bump;
providing a redistribution wiring layer, the redistribution wiring layer comprising:
a landing pad connected to a first contact point; and
a connection line connected between a second contact point and a tip of the elastic contact structure; and
providing a solder contact structure on the landing pad.

30. The method of claim 29, further comprising:
providing a solder stop layer between adjacent components of the redistribution wiring layer.

31. The method of claim 30, wherein the elastic contact structure is provided by at least one of a printing and a screening process.

32. The method of claim 31, wherein a plurality of solder contact structures and a plurality of elastic contact structures are provided, wherein the solder contact structures are arranged within a first surface area in which the solder contact structures in a soldered condition are subjected to a shear stress due to thermo-mechanical expansion mismatch which is lower than a predetermined shear stress value.

33. The method of claim 32, wherein the first surface area is substantially positioned in a central area of the contacting area and wherein the elastic contact structures are positioned in a second surface area outside the first surface area.

34. The method of claim 33, further comprising:
positioning the integrated circuit on a printed circuit board having a plurality of contact pads, wherein the elastic contact structure and the solder contact structure are aligned with respective contact pads; and
soldering the solder contact pad to the respective contact pad on the printed circuit board.

* * * * *